(12) United States Patent
Liu et al.

(10) Patent No.: US 7,969,022 B1
(45) Date of Patent: Jun. 28, 2011

(54) DIE-TO-DIE WIRE-BONDING

(75) Inventors: Chenglin Liu, San Jose, CA (US);
Shiann-Ming Liou, Campbell, CA (US)

(73) Assignee: Marvell International Ltd., Hamilton (BM)

( * ) Notice: Subject to any disclaimer, the term of this patent is extended or adjusted under 35 U.S.C. 154(b) by 358 days.

(21) Appl. No.: 12/053,253

(22) Filed: Mar. 21, 2008

Related U.S. Application Data

(60) Provisional application No. 60/896,150, filed on Mar. 21, 2007.

(51) Int. Cl.
*H01L 23/48* (2006.01)
*H01L 29/40* (2006.01)
*H01L 23/495* (2006.01)

(52) U.S. Cl. ........ 257/784; 257/673; 257/737; 257/738; 257/780

(58) Field of Classification Search .................. 257/673, 257/737, 780, 784, 723, 685, 686, 777, 738, 257/E23.021, E23.033, E21.508
See application file for complete search history.

(56) References Cited

U.S. PATENT DOCUMENTS

| | | | | |
|---|---|---|---|---|
| 5,828,128 | A * | 10/1998 | Higashiguchi et al. | 257/738 |
| 6,905,954 | B2 * | 6/2005 | Hedler et al. | 438/612 |
| 6,972,496 | B2 * | 12/2005 | Choi | 257/780 |
| 7,064,425 | B2 * | 6/2006 | Takahashi et al. | 257/686 |
| 2003/0062631 | A1 * | 4/2003 | Nemoto | 257/787 |
| 2008/0290508 | A1 * | 11/2008 | Sukegawa et al. | 257/724 |
| 2009/0014858 | A1 * | 1/2009 | Boon et al. | 257/686 |
| 2009/0321951 | A1 * | 12/2009 | Takiar et al. | 257/777 |

* cited by examiner

*Primary Examiner* — Teresa M Arroyo

(57) ABSTRACT

Methods for die-to-die wire-bonding, and devices and systems formed thereby, are described herein. A die to die wire-bonding method may comprise bonding a first conductive bump having a first bump size to a first die pad; bonding a first wire to a second die pad, the first wire bonded to the second die pad by a second conductive bump having a second bump size, the second bump size being smaller than the first bump size; and bonding the first wire to the first conductive bump.

7 Claims, 4 Drawing Sheets

DIE-TO-DIE WIRE-BONDING

CROSS-REFERENCE TO RELATED APPLICATIONS

The present application claims priority to U.S. Provisional Patent Application No. 60/896,150, filed Mar. 21, 2007, the entire disclosure of which is hereby incorporated by reference in its entirety.

TECHNICAL FIELD

Embodiments of the present invention relate to the field of microelectronic packaging, in particular, to die-to-die wire-bonding.

BACKGROUND

The demand for increasingly smaller devices has posed a number of challenges at least in terms of manufacturing. One area in particular is die-to-die wire-bonding. As die pad openings and die pad pitches have become smaller, wires having smaller diameters have had to be used for wire-bonding so that the bumps formed therefrom (by electrostatic charge, for example) can be bonded to the die pads. Although sized to accommodate the smaller die pad openings and die pad pitches, their small bump size may also lead to undesirable quality and reliability of the bonds. This may particularly be the case if the die pads have been probed or otherwise scuffed.

SUMMARY OF THE INVENTION

In view of the problems in the state of the art, embodiments of the invention are directed to methods for die-to-die wire-bonding. More specifically, with the foregoing and other items in view, there is provided, in accordance with various embodiments of the invention, a method comprising bonding a first conductive bump having a first bump size to a first die pad; bonding a first wire to a second die pad, the first wire bonded to the second die pad by a second conductive bump having a second bump size, the second bump size being smaller than the first bump size; and bonding the first wire to the first conductive bump.

In various embodiments, the method may further comprise forming the second conductive bump on an end of the first wire, the first wire having a first wire diameter, and forming the first conductive bump on an end of a second wire having a second wire diameter, the second wire diameter being larger than the first wire diameter. In some embodiments, a first bond tool may be used for bonding the first conductive bump to the first die pad, and second bond tool used for bonding the second conductive bump to the second die pad.

In various embodiments, the first conductive bump may be bump-bonded to the first die pad, and a first end of the first wire may be bump-bonded to the second die pad. In some embodiments, a second end of the first wire may be wedge-bonded to the first conductive bump.

In various embodiments, the first conductive bump and/or the second conductive bump may comprise a material selected a group consisting of gold, aluminum, silver, and copper.

In embodiments, the first die pad may be disposed on a first die and the second die pad may be disposed on a second die. In various ones of these embodiments, a third die may be placed over the first die, the third die including a third die pad, and a third conductive bump may be bonded to the third die pad. In various embodiments, a second wire may be bonded to the second die pad having the first wire bonded thereto, the second wire bonded to the second die pad by a fourth conductive bump. In various embodiments, the second wire may be bonded directly to the second conductive bump.

In various embodiments, the first conductive bump may be bonded to a first die pad disposed on a wafer. In various ones of these embodiments, the wafer having the first conductive bump bonded thereto may be backgrinded having the first conductive bump bonded thereto. In some embodiments, the backgrinded wafer may be diced to form a plurality of dies, at least one of the dies having the first conductive bump disposed thereon.

In various embodiments, a conductive layer may be formed over the first die pad, and the first conductive bump may be bonded to the conductive layer.

There is also provided, in accordance with various embodiments of the present invention, a device including one or more dies as described. For example, in various embodiments, a device may comprise a first die having a first die pad and a first conductive bump bonded to the first die pad, the first conductive bump having a first bump size; a second die having a second die pad and a second conductive bump bonded to the second die pad, the second conductive bump having a second bump size smaller than the first bump size; and a first wire having a first end and a second end, wherein the first end is bonded to the first conductive bump and the second end is bonded to the second conductive bump.

A system is also provided. In various embodiments, the system may comprise the semiconductor device as described, a bus coupled to the semiconductor device, and a mass storage coupled to the bus.

Other features that are considered as characteristic for embodiments of the invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous. The phrase "A/B" means A or B. For the purposes of the present invention, the phrase "A and/or B" means "(A), (B), or (A and B)." The phrase "at least one of A, B, and C" means "(A), (B), (C), (A and B), (A and C), (B and C), or (A, B, and C)." The phrase "(A)B" means "(B) or (AB)," that is, A is an optional element.

The terms chip, die, integrated circuit, monolithic device, semiconductor device, and microelectronic device are often used interchangeably in the microelectronics field. The present invention is applicable to all of the above as they are generally understood in the field.

Various embodiments of the present invention are directed to methods for die-to-die wire-bonding. In some embodiments, a large bump may be bonded to a die pad of a first die and a smaller bump may be bonded to a die pad of a second die, one end of a wire then bonded to the large bump and the other end bonded to the smaller bump. In various embodiments, the differing sizes of bumps may be achieved using at least two different bond tools. For example, the large bump may be bonded using a first bond tool, while the smaller bump and wire may be bonded using a second bond tool. The first bond tool may be a bond tool configured to use larger diameter wire relative to the second bond tool.

Figure 1:
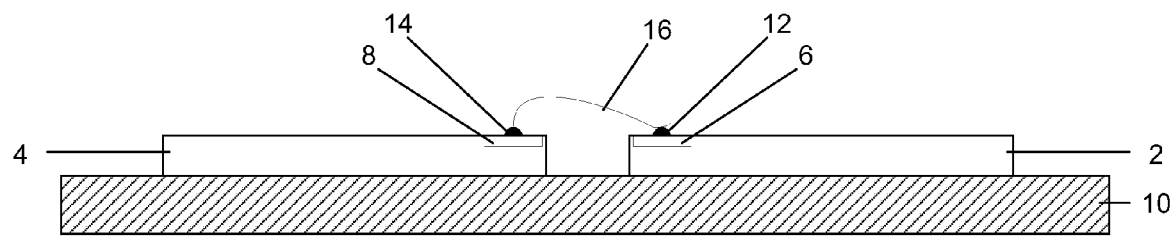
FIG. 1 illustrates a cross-sectional view of prior art wire-bonded dies.

Various embodiments of the present invention may be more easily understood in the context of the prior art. Turning to FIG. 1, illustrated is an exemplary prior art pair of wire-bonded dies 2, 4. A first die 2 including a first die pad 6 and a second die 4 including a second die pad 8 are mounted onto a substrate 10 (such as, for example, a carrier substrate). A first conductive bump 12 is formed on first die 2, and a second conductive bump 14 is formed on second die 4. A wire 16 connects the conductive bumps 12, 14, one end ball-bonded when forming second conductive bump 14 and the other end of the wire wedge-bonded to first conductive bump 12. Although second conductive bump 14 is referred to herein as being a distinct structure, it may be generally understood that second conductive bump 14 is formed during the wire-connecting operation (i.e., when bonding wire 16 to second die pad 8 by melting an end of wire 16 as opposed to during a separate bump-forming operation).

Although it may be possible to wedge-bond wire 16 directly onto first die pad 6, it may be difficult to do so, and/or difficult to do so without damaging first die pad 6. Accordingly, first bump 12 may be formed on first die pad 6 onto which wire 16 is wedge-bonded.

For forming first bump 12, a wire bonding tool usually melts an end of a wire (e.g., gold wire) to form a ball and then ball bonds the ball (first bump 12) onto first die pad 6. Then, the same wire bonding tool forms another ball by melting an end of a wire and bonds this ball (second bump 14) onto first die pad 6, loops wire 16 (still connected to second bump 14) to first bump 12, and wedge bonds wire 16 to first bump 12. After cutting wire 16, a structure similar to that illustrated in FIG. 1 may remain.

As described, first bump 12 and second bump 14 are formed on dies 2, 4 using the same bond tool. Wire 16 is also provided using the same bond tool. Accordingly, the die pitch and/or die pad opening size of first die 2 and/or second die 4 may dictate the diameter of wire 16 to be used. The smaller the diameter of wire 16, however, the smaller the size of bumps 12, 14. For wedge-bonding wire 16 to first bump 12, the size of first bump 12 may affect the reliability and/or quality of the wedge-bond. More particularly, the smaller the size of first bump 12, the more likely the reliability and/or quality of the wedge-bond will be negatively impacted.

In various embodiments of the present invention, using varying sizes of bumps may result in high reliability and/or quality bonding. Bonding to a bump having a bump size larger than can be provided by the small-diameter wire may be particularly beneficial in cases wherein wedge-bonding is enlisted. Although varying sizes of bumps may be useful in a number of applications, exemplary applications may include those wherein one die has a finer pitch than another die. Sometimes, small diameter wire may be used to avoid problems such as, for example, shorting resulting from touching wires, which may be more likely to occur with fine pitched dies.

Figure 2:
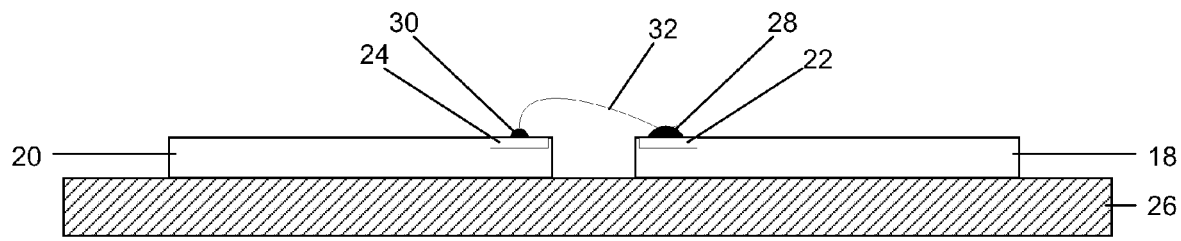
FIG. 2 illustrates a cross-sectional view of a pair of wire-bonded dies in accordance with various embodiments of the present invention.

Referring now to FIG. 2, illustrated is a cross-sectional view of a pair of wire-bonded dies 18, 20 in accordance with various embodiments of the present invention. First die 18 includes a first die pad 22 and a second die 20 includes a second die pad 24. First die 18 and second die 20 may be mounted on a substrate 26. For example, first die 18 and second die 20 may be mounted onto a carrier substrate for packaging.

As illustrated, a first conductive bump 28 is bonded to first die pad 22 and a second conductive bump 30 is bonded to second die pad 24, first bump 28 being larger than second bump 30, and a first end of a wire 32 is bonded to first bump 28 and a second end of wire 32 is bonded to second bump 30. Although second bump 30 may be referred to herein as being a distinct structure, in various embodiments second bump 30 may be formed during the wire-connecting operation (i.e., when bonding wire 32 to second die pad 24 by melting an end of wire 32 as opposed to during a separate bump-forming operation). In various embodiments, second bump 30 is formed using wire 32 using any one of various techniques including, for example, electrostatic charge or heating an end of wire 32. Accordingly, the size of second bump 30 may be dictated, at least in part, by the diameter of wire 32.

To that end, in various embodiments, first bump 28 may be formed on an end of one wire (not illustrated) having a first wire diameter and second bump 30 may be formed on an end of another wire (wire 32 as illustrated) having a second wire diameter smaller than the first wire diameter. For forming first bump 28 and second bump 30, different bond tools may be used. For example, a first bond tool may be used for forming first bump 28 and a second bond tool may be used for forming second bump 30. As first bump 28 is larger than second bump 30, first bond tool may be configured to use larger diameter wire than the wire 32 used for second bond tool. In some embodiments, however, a single tool configured to accommodate more than one diameter of wire could be used for forming first bump 28 and second bump 30.

In various embodiments, first bump 28 and second bump 30 may be bump-bonded to first die pad 22 and second die pad 24, respectively, and second end of wire 32 may be wedge-bonded to first bump 28. A single bond tool may be used for both bump-bonding second bump 30 and wedge-bonding second end of wire 32 to first bump 28.

One or both of first bump 28 and second bump 30 may comprise a selected one or more of gold, aluminum, silver, or copper. In some embodiments, for example, first bump 28 and second bump 30 may both comprise gold, in which case wire 32 also would comprise gold. In various other embodiments, however, first bump 28 may comprise one material while second bump 30 and wire 32 comprise another different material, depending on the particular application.

It is noted that first bump 28 may be formed on first die 18 either at die level or wafer level (or both), depending on the application. For example, in various embodiments, first bump 28 may be bonded to first die pad 22 while first die 18 is still part of a wafer (i.e., prior to dicing) (not illustrated). In various ones of these embodiments, the wafer including first die 18 may be backgrinded either during or after bonding of first bump 28, and the backgrinded wafer may be diced into a plurality of dies, at least one of the dies having the first conductive bump 28 disposed thereon. In other embodiments, first bump 28 may be bonded to first die 18 after the wafer including first die 18 has been backgrinded and diced.

Figure 3:
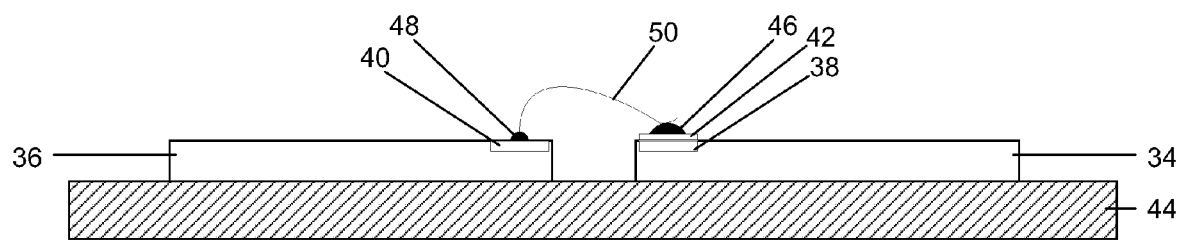
FIG. 3 illustrates a cross-sectional view of another pair of wire-bonded dies in accordance with various embodiments of the present invention.

In various embodiments, instead of or in addition to forming a larger first bump, a conductive layer may be formed over a die pad for wedge-bonding a wire thereto. For example and illustrated in FIG. 3, a first die 38 includes a first die pad 38 and a second die 36 including a second die pad 40, first die pad 38 having a conductive layer 42 formed thereover. In various embodiments, conductive layer 42 comprises gold. First die 34 and second die 36 may be mounted on a substrate 44. A first conductive bump 46 may be bonded to conductive layer 42 and a second conductive bump 48 may be formed on second die pad 40. Second bump 48 may be formed by bump-bonding with one end of wire 50, and the other end of wire may be wedge-bonded to first bump 46, as described more fully above.

Figure 4:
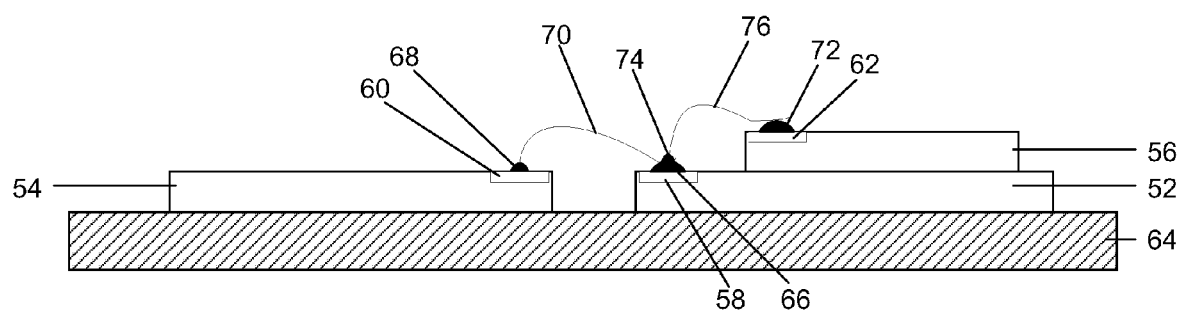
FIG. 4 illustrates a cross-sectional view of three wire-bonded dies in accordance with various embodiments of the present invention.
Figure 5:
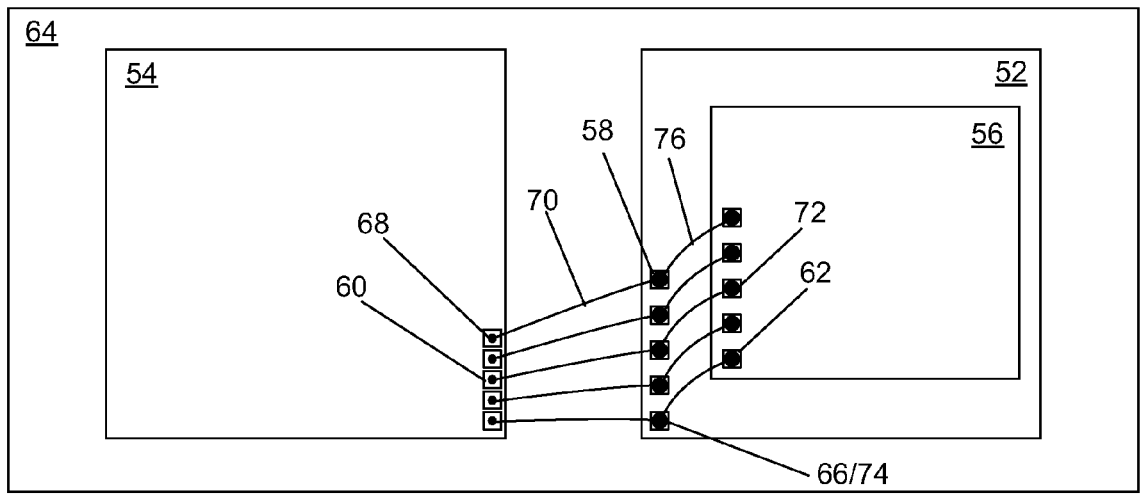
FIG. 5 illustrates a top view of the three wire-bonded dies of FIG. 4.

Although the foregoing embodiments are described with respect to devices including two dies, various embodiments of the present invention may be practiced for devices including more than two dies. As illustrated in FIG. 4 (cross-sectional view) and FIG. 5 (top view), for example, a device may include a first die 52 including a first die pad 58, a second die 54 including a second die pad 60 mounted on substrate 64, and a third die 56 including a third die pad 62 mounted on first die 52.

As described more fully herein, a first conductive bump 66 may be bonded to first die pad 58 and a second conductive bump 68 may be bonded to second die pad 60. Second bump 68 may be formed by bump bonding using a first end of a wire 70 and first bump 66 may be formed by bump bonding using another wire (not illustrated) having a larger diameter than that of wire 70. Second end of wire 70 may be wedge-bonded to first bump 66.

A third conductive bump 72 may be bonded to third die pad 62 and a fourth conductive bump 74 may be bonded to first conductive bump 66. In various other embodiments, third conductive bump 72 may be omitted, depending on the application. First bump 66 and third bump 72 (when included) may be larger in size relative to second bump 68 and fourth bump 74, using wires of different diameters as discussed more fully herein.

In various embodiments, fourth conductive bump 74 may be bonded on first bump 66, with first bump 66 having the first end of wire 70 wedge-bonded thereto.

Fourth bump 74 may be formed by bump bonding using a first end of a wire 76 and third bump 72 may be formed by bump bonding using another wire (not illustrated) having a larger diameter than that of wire 76, similar to the forming of first bump 66 and second bump 68. Second end of wire 76 may be wedge-bonded to fourth bump 74. In various embodiments, third bump 72 and fourth bump 74 may be formed using other methods, depending on the application.

These embodiments may be useful in situations wherein first die pad 58 may not have a size large enough to accommodate bonding side-by-side. For example, as illustrated more clearly in FIG. 5, first die pad 58 may not be large enough more than one bump. In other embodiments, fourth bump 74 may be bonded to first bump 66 not necessarily for size reasons. First bump 66 being a larger sized bump may, for example, provide a better bonding surface relative to first die pad 58 itself in terms of surface quality and/or easier access.

Figure 6:
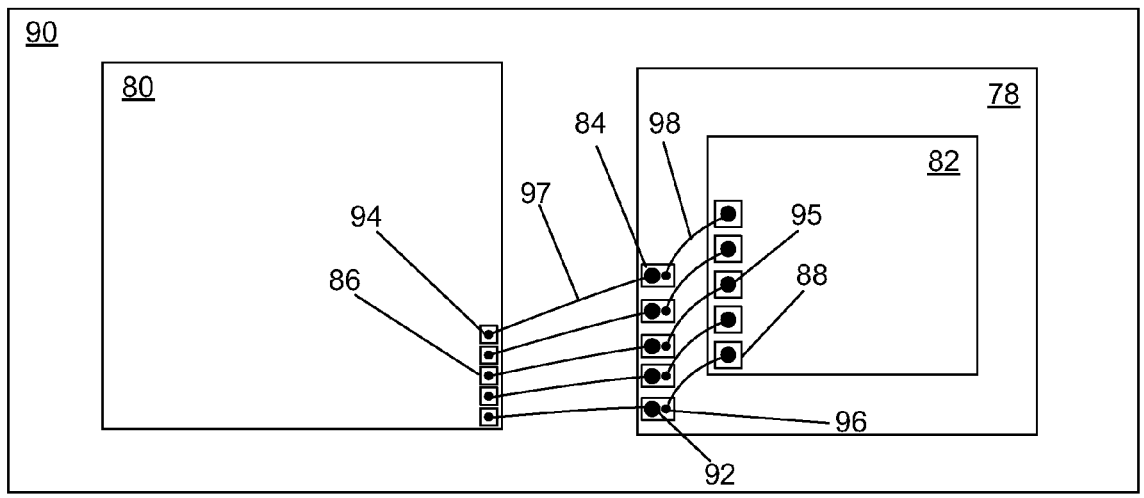
FIG. 6 illustrates a top view of another pair of wire-bonded dies in accordance with various embodiments of the present invention.

In other embodiments, the fourth conductive bump may instead be bonded on first die pad along with first bump, as illustrated in FIG. 6. In the illustrated embodiment, a device may include a first die 78 including a first die pad 84, a second die 80 including a second die pad 86 mounted on a substrate 90. A third die 82 including a third die pad 88 may be mounted on first die 78. A first bump 92 may be bonded to first die pad 84, a second bump 94 bonded to second die pad 86, and a third bump 95 bonded to third die pad 88. In various embodiments, a fourth conductive bump 96 may be bonded on first bump 92, with first bump 92 having the first end of wire 97 wedge-bonded thereto.

Fourth bump 96 may be formed by bump bonding using a first end of a wire 98 and third bump 95 may be formed by bump bonding using another wire (not illustrated) having a larger diameter than that of wire 98, similar to the forming of first bump 92 and second bump 94. Second end of wire 98 may be wedge-bonded to fourth bump 96. In various embodiments, third bump 95 and fourth bump 96 may be formed using other methods, depending on the application. In contrast to the orientation of FIG. 6, a fourth conductive bump 96 is bonded on first die pad 84 along with first bump 92, rather than on top of first bump 92.

Figure 7:
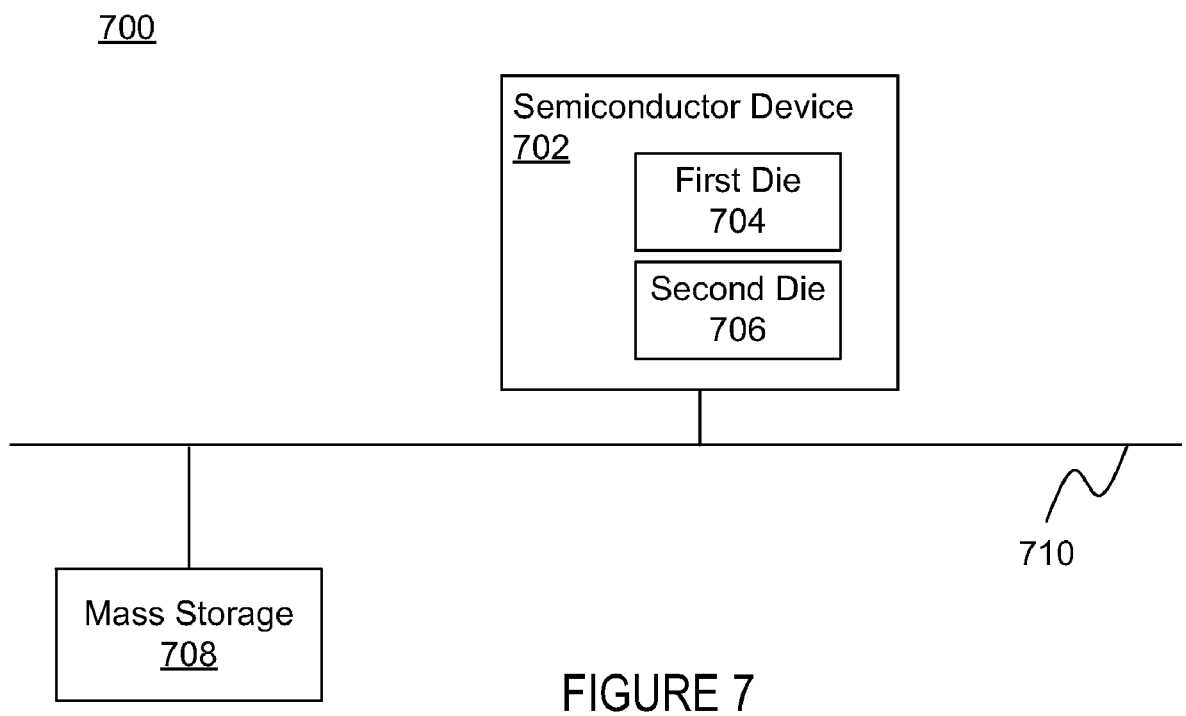
FIG. 7 illustrates a system including wire-bonded dies in accordance with various embodiments of the present invention.

Referring to FIG. 7, illustrated is a system 700 in accordance with some embodiments. System 700 includes a device 702 and a mass storage device 708 that may be coupled to a bus 710. Device 702 may include a first die 704 and second die 706 advantageously incorporating variously-sized bumps as described herein. For example, first die 704 may include a first die pad and a first conductive bump bonded to the first die pad, the first conductive bump having a first bump size. Second die 706 may include a second die pad and a second conductive bump bonded to the second die pad, the second conductive bump having a second bump size smaller than the first bump size. A first end of a wire may be bonded to the first conductive bump and a second end of the wire may be bonded to the second conductive bump.

Device 702 may be included in any one or more of memory, a network interface, transceivers, microprocessors, and so forth, of system 700.

Depending on the application, system 700 may include other components, including but not limited to non-volatile memory, chipsets, other mass storage (such as hard disk, compact disk (CD), digital versatile disk (DVD), graphical or mathematic co-processors, and so forth.

In various embodiments, system 700 may be a personal digital assistant (PDA), a wireless mobile phone, a tablet computing device, a laptop computing device, a desktop computing device, a set-top box, an entertainment control unit, a digital camera, a digital video recorder, a CD player, a DVD player, a network server, or device of the like.

Although certain embodiments have been illustrated and described herein for purposes of description of a preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An apparatus comprising:
   a first die having i) a first die pad and ii) a first conductive bump bonded to the first die pad, the first conductive bump having a first bump size;
   a second die having i) a second die pad and ii) a second conductive bump bonded to the second die pad, the second conductive bump having a second bump size that is smaller than the first bump size; and
   a first wire having i) a first end and ii) a second end, wherein i) the first end is bonded to the first conductive bump and ii) the second end is bonded to the second conductive bump.

2. The apparatus of claim 1, wherein:
   the first conductive bump is bump-bonded to the first die pad;
   the second conductive bump is bump-bonded to the second die pad; and
   the second end of the first wire is wedge-bonded to the first conductive bump.

3. The apparatus of claim 1, further comprising:
   a third die mounted on the first die, the third die including i) a third die pad and ii) a third conductive bump bonded to the third die pad.

4. The apparatus of claim 3, further comprising:
   a fourth conductive bump bonded to the first conductive bump such that the fourth conductive bump is disposed on the first conductive bump.

5. The apparatus of claim 4, further comprising:
   a second wire having i) a first end bonded to the fourth conductive bump and ii) a second end bonded to the third conductive bump.

6. The apparatus of claim 3, further comprising:
   a fourth conductive bump bonded to the first die pad; and
   a second wire having i) a first end bonded to the fourth conductive bump and ii) a second end bonded to the third conductive bump.

7. The apparatus of claim 1, wherein:
   the first die pad includes a conductive layer formed on the first die pad; and
   the first conductive bump is bonded to the conductive layer.

* * * * *